(12) United States Patent
Lin et al.

(10) Patent No.: US 8,927,333 B2
(45) Date of Patent: Jan. 6, 2015

(54) DIE CARRIER FOR PACKAGE ON PACKAGE ASSEMBLY

(75) Inventors: Tsung-Shu Lin, New Taipei (TW); Yu-Ling Tsai, Hsinchu (TW); Han-Ping Pu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/302,059

(22) Filed: Nov. 22, 2011

(65) Prior Publication Data

US 2013/0127040 A1 May 23, 2013

(51) Int. Cl.
*H01L 21/00* (2006.01)
*H01L 21/76* (2006.01)
*H01L 23/48* (2006.01)
*H01L 23/552* (2006.01)
*H01L 25/10* (2006.01)

(52) U.S. Cl.
CPC ....... *H01L 25/105* (2013.01); *H01L 2225/1017* (2013.01); *H01L 2225/1041* (2013.01);

(Continued)

(58) Field of Classification Search
CPC ............... H01L 23/3107; H01L 23/36; H01L 23/49548; H01L 23/49562; H01L 24/34; H01L 2924/01079; H01L 2924/14; H01L 2924/01029; H01L 2924/01078; H01L 2924/15311; H01L 23/522; H01L 23/3121; H01L 23/28; H01L 23/50; H01L 23/538; H01L 23/48; H01L 23/49838; H01L 23/97; H01L 23/49805; H01L 23/0657; H01L 23/49816; H01L 23/34; H01L 2224/80815; H01L 2224/81815; H01L 2224/82815; H01L 2224/83815; H01L 2224/84815; H01L 2224/85815; H01L 2224/86815; H01L 2224/0383; H01L 2224/03849; H01L 2224/11849; H01L 2224/2783; H01L 2224/27849; H01L 21/76882; H01L 24/49; H01L 24/16; H01L 24/17; H01L 24/32; H01L 24/48; H01L 24/73; H01L 24/97
USPC ............ 438/107, 113, 15, 25, 26, 51, 55, 64, 438/106, 428, 436, 438, 632, 646, 698, 438/760; 257/531, 659, 660, 667, 676, 678, 257/687, 700, 734, 737, 774, 777, E21.588, 257/E21.001, E21.499, E23.114, E23.01, 257/E23.061
See application file for complete search history.

(56) References Cited

U.S. PATENT DOCUMENTS 5,144,747 A * 9/1992 Eichelberger ................... 29/834
2007/0228579 A1* 10/2007 Kang ............................ 257/777

(Continued)

*Primary Examiner* — Julio J. Maldonado
*Assistant Examiner* — Moazzam Hossain
(74) *Attorney, Agent, or Firm* — Eschweiler & Associates, LLC

(57) ABSTRACT

A package-on-package arrangement for maintaining die alignment during a reflow operation is provided. A first top die has a first arrangement of solder bumps. A bottom package has a first electrical arrangement to electrically connect to the first arrangement of solder bumps. A die carrier has a plurality of mounting regions defined on its bottom surface, wherein the first top die is adhered to the die carrier at a first of the plurality of mounting regions. One of a second top die and a dummy die having a second arrangement of solder bumps is also fixed to the die carrier at a second of the plurality of mounting regions of the die carrier. The first and second arrangements of solder bumps are symmetric to one another, therein balancing a surface tension during a reflow operation, and generally fixing an orientation of the die carrier with respect to the bottom package.

8 Claims, 7 Drawing Sheets

(52) U.S. Cl.
CPC .................. *H01L 2225/1058* (2013.01); *H01L 2224/16225* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01)
USPC ............. 438/107; 438/106; 438/760; 438/15; 438/51; 438/632; 257/737; 257/660; 257/E21.588; 257/E21.499; 257/E23.01

(56) References Cited

U.S. PATENT DOCUMENTS

2008/0164620 A1* 7/2008 Lin et al. ..................... 257/778
2010/0327424 A1* 12/2010 Braunisch et al. ........... 257/692

* cited by examiner

DIE CARRIER FOR PACKAGE ON PACKAGE ASSEMBLY

BACKGROUND

In the semiconductor industry, feature sizes of components on an integrated circuit (IC) package have become smaller in order to minimize a footprint of the IC package, while also decreasing a power demand associated with the IC package. Such a decrease in feature size and power demand, however, places significant demands on semiconductor processing capabilities. In the recent past, it has proven difficult to keep up with the demand for such a continued decrease in minimum feature sizes while maintaining a small footprint of the final IC package.

One technique used for minimizing a footprint of an IC package is called Package on Package (POP) processing, wherein two or more individual component IC dies are arranged or stacked vertically in a single package. Vertically interconnecting multiple IC dies to act as a single IC chip or package generally shortens an interconnection distance between individual component IC dies, thereby improving processing speed and reducing power consumption.

In a conventional POP process, one or more top dies are vertically stacked over a bottom die and/or intermediate substrate in order to minimize the footprint of the final IC package. Solder bumps are sometimes provided on a bottom surface of the top die in a Ball Grid Array (BGA), wherein the solder bumps are melted or "reflowed" once the top die is stacked on the bottom die and/or an intermediate substrate, therein electrically connecting the top die to the bottom die and/or intermediate substrate. In general, alignment of the top die to a specific pattern on the bottom die and/or intermediate substrate is performed manually, with a separate placement of each respective top die onto the bottom die and/or substrate. Achieving proper alignment during reflow operations has thus far proven to be difficult.

SUMMARY OF THE INVENTION

The following presents a simplified summary in order to provide a basic understanding of one or more aspects of the disclosure. This summary is not an extensive overview of the disclosure, and is neither intended to identify key or critical elements of the invention, nor to delineate the scope thereof. Rather, the primary purpose of the summary is to present some concepts of the disclosure in a simplified form as a prelude to the more detailed description that is presented later.

In one embodiment, the present disclosure relates to a package-on-package arrangement and a method for maintaining die alignment during a reflow operation. In one example, the package-on-package arrangement comprises a first top die having a first arrangement of solder bumps associated with a bottom surface of the first top die. A bottom package is further provided, wherein the first arrangement of solder bumps of the first top die are configured to electrically connect the first top die to a first electrical arrangement on a top surface of the bottom package.

In accordance with one particular example, a die carrier having a plurality of mounting regions defined on a bottom surface thereof is provided, wherein a top surface of the first top die is adhered to the die carrier at a first of the plurality of mounting regions on the die carrier. One of a second top die or a dummy die is further generally fixed to the die carrier at a second of the plurality of mounting regions of the die carrier. In one example, the one of a second top die and dummy die comprises a second arrangement of solder bumps associated with a respective bottom surface thereof.

According to another example of the disclosure, the first arrangement of solder bumps and second arrangement of solder bumps are generally symmetric to one another when viewed perpendicular to the bottom surface of the die carrier. Thus, a balancing of a surface tension associated with a melting of the first arrangement of solder bumps and second arrangement of solder bumps is provided during a reflow operation, therein generally fixing an orientation of the die carrier with respect to the bottom package, and thus, the orientation of the first top die and the one of the second top die and dummy die is generally fixed with respect to the bottom package.

In another embodiment, the present disclosure relates to a method of maintaining die alignment during a reflow operation. In one example, the method comprises determining a first mounting region on a die carrier based on a mating of a first arrangement of solder bumps associated with a first top die and a first electrical arrangement on a bottom package. One or more of a second mounting region on the die carrier and a second arrangement of solder bumps on one or more of a second top die and a dummy die are further determined, wherein the determination is based, at least in part, on a symmetry of the first and second arrangements of solder bumps to one another when viewed perpendicular to a bottom surface of the die carrier.

In one example, the first top die is coupled to the first mounting region of the die carrier, and one of the second die and dummy die is coupled to the second mounting region of the die carrier, such as via an adhesive layer formed over a bottom surface of the die carrier. The die carrier is then placed over the bottom package, therein matingly contacting at least the first arrangement of solder bumps with the first electrical arrangement. The first and second arrangements of solder bumps are subsequently reflowed, wherein the symmetry between the first and second arrangements of solder bumps generally balances a surface tension associated with a melting of the first and second arrangements of solder bumps, and wherein the die carrier generally fixes an orientation of at least the first top die with respect to the bottom package.

The following description and annexed drawings set forth in detail certain illustrative aspects and implementations of the disclosure. These are indicative of but a few of the various ways in which the principles of the invention may be employed.

DETAILED DESCRIPTION

Figure 1:
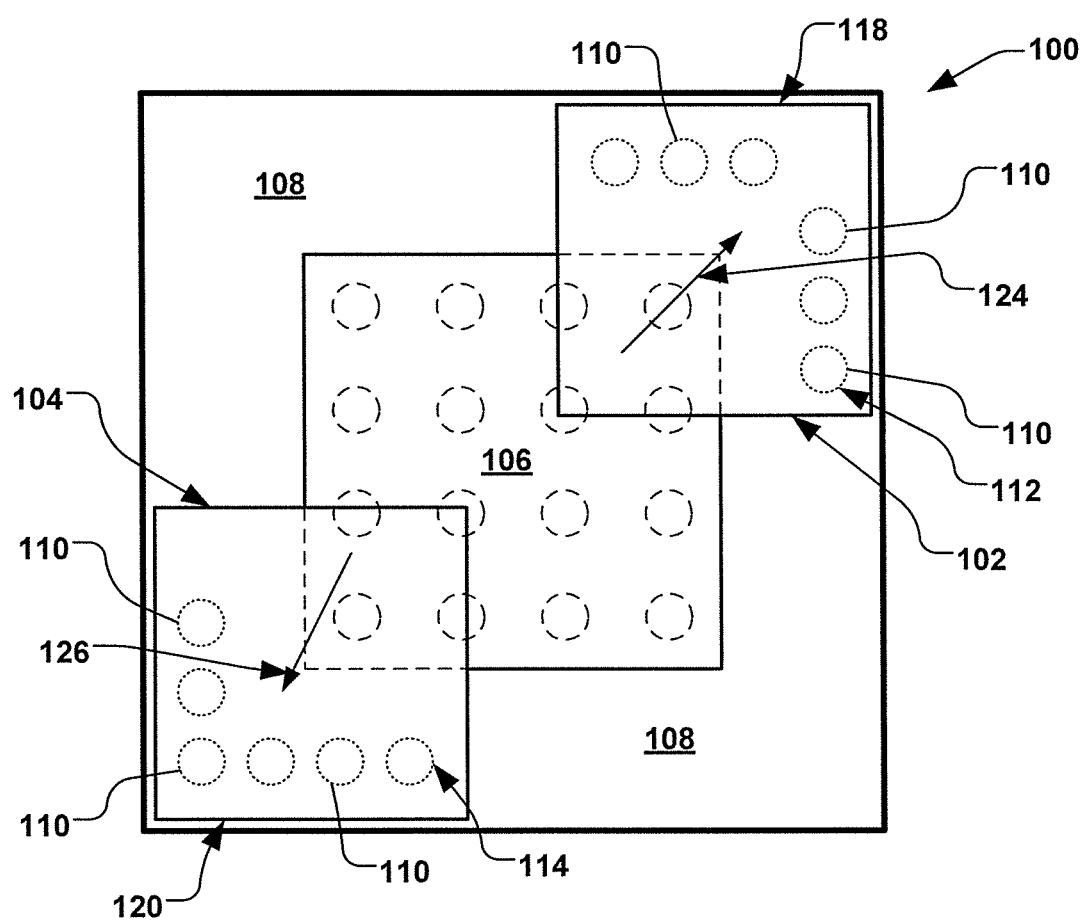
FIG. 1 illustrates a top view of one example of a package-on-package arrangement.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Some aspects of the present disclosure provide for a robust package-on-package (POP) arrangement, as well as an efficient method of aligning and mounting one or more top dies (also called die packages) onto a bottom die (also called a bottom die package) and/or intermediate substrate, as well as maintaining the alignment of the one or more top dies during a reflow process, wherein solder balls are melted to secure electrical contact between the one or more top dies and bottom die.

In modern synchronous dynamic random access memory (SDRAM) applications, for instance, the one or more top dies are often smaller than the bottom die or the overall intermediate substrate. In such a case, the one or more first dies are placed over the bottom die or intermediate substrate, and are soldered to portions of the bottom die or intermediate substrate.

Referring now to the Figures, FIG. 1, for example, illustrates an exemplary observation in a stacked package arrangement 100, such as in a wafer level chip scale package (WLCSP). In the present example, one or more top dies 102 and 104 are positioned over a bottom die 106 and/or intermediate substrate 108, wherein the one or more top dies have a plurality of solder balls 110 (shown in phantom) associated therewith. The plurality of solder balls 110, for example, generally define respective ball grid arrays (BGAs) 112 and 114 associated with the respective one or more top dies 102 and 104.

Figure 2A:
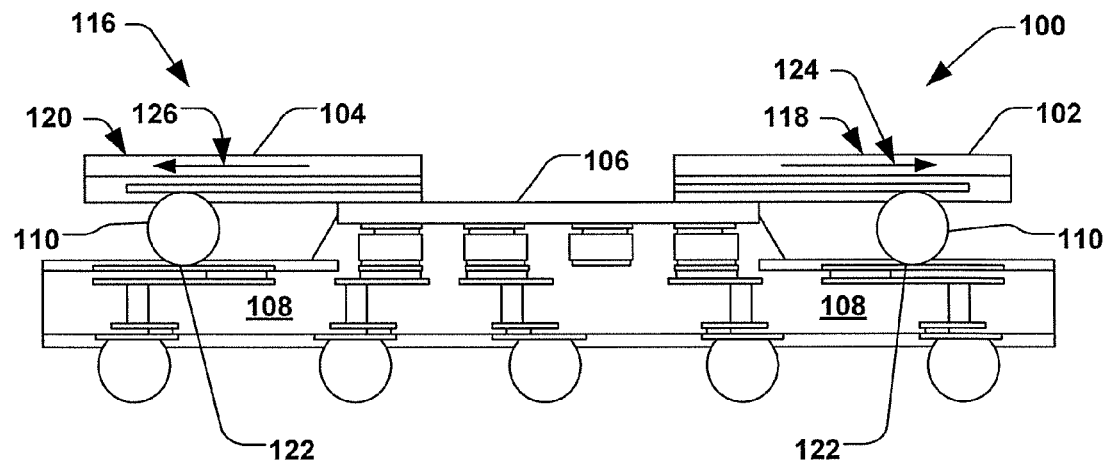
FIGS. 2A-2B illustrate cross sectional views of an example package-on-package arrangement showing package movement.
Figure 2B:
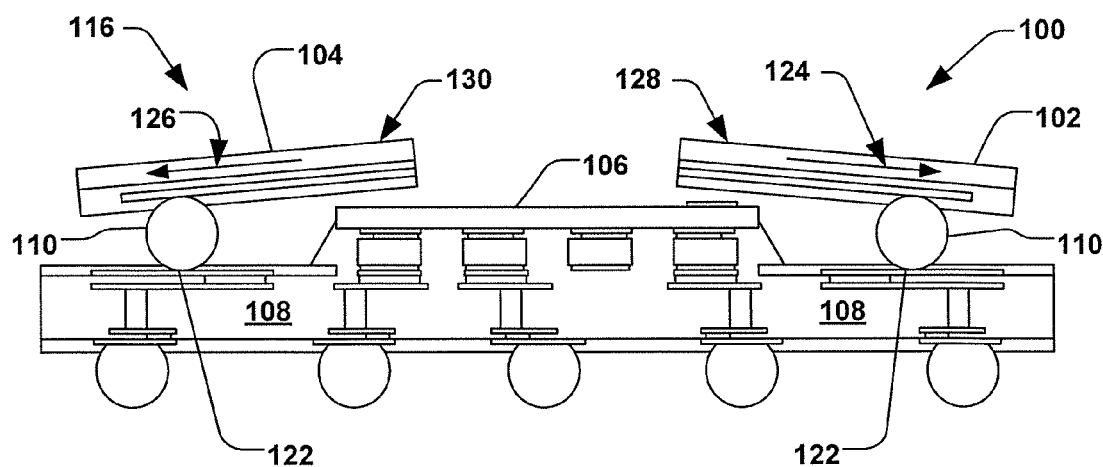

FIGS. 2A-2B illustrate an exemplary cross-section 116 of the stacked package arrangement 100. Conventionally, the one or more top dies 102 and 104 are individually placed over the bottom die 106 and/or intermediate substrate 108 in respective positions 118 and 120 illustrated in FIGS. 1 and 2A, wherein the plurality of solder balls 110 generally contact a plurality of contact pads 122 associated with the bottom die and/or intermediate substrate. Accordingly, during a reflow process, the plurality of solder balls 110 are melted in order to secure an electrical contact between the one or more top dies 102 and 104 to the bottom die 106 and/or intermediate substrate 108.

During reflow operations, it is believed that surface tension associated with the melting of the solder balls 110, in conjunction with a physical arrangement of the solder balls 110 with respect to the one or more top dies 102 and 104 and the bottom die 106 and/or intermediate substrate 108, has a tendency to create a force (illustrated as arrows 124 and 126 in FIGS. 1 and 2A-2B) that will cause the one or more top dies to shift during the reflow process, therein moving the one or more top dies from their original respective positions 118 and 120 of FIG. 2A to respective skewed positions 128 and 130 of FIG. 2B. Such a shift can be deleterious to the electrical contact between the one or more top dies 102 and 104 to the bottom die 106 and/or intermediate substrate 108, and can further cause interconnection alignment issues during further processing of the stacked package arrangement 100.

Thus, as will be described further hereafter and referencing FIGS. 3-5, in general, a package-on-package (POP) arrangement 200 is provided for advantageously maintaining die alignment during a reflow operation. According to one embodiment, the POP arrangement 200 comprises a first top die 202, wherein the first top die comprises a first arrangement 204 of solder bumps 206 associated with a bottom surface 208 of the first top die 202. The POP arrangement 200 further comprises a bottom package 210 and/or an intermediate substrate 212, wherein the first arrangement 204 of solder bumps 206 of the first top die 202 are generally to electrically connect the first top die 202 to a first electrical arrangement 214 on a top surface 216 of the bottom package 210 and/or intermediate substrate 212. In one example, the bottom package 210 comprises a bond on trace (BOT) package, wherein the first electrical arrangement 214 on the top surface 216 of the bottom package 210 comprises one or more electrically conductive traces defined thereon.

It should be noted that while the bottom package 210 is described and/or illustrated as a bottom die or integrated circuit, various other implementations of the present disclosure are contemplated, and the present disclosure is not limited to such a bottom die or integrated circuit. Likewise, the present disclosure is not limited to a discrete number of top dies, bottom dies, or intermediate substrates, and is applicable to any number of such dies and/or substrates utilized in a package-on-package architecture. For example, the present disclosure is applicable to wafer-level chip scale packages (WLCSPs), flip-chip chip scale packages (FCCSPs), plastic ball grid array (PBGA) packages, packages having thru-substrate vias (TSVs), and any other bond on trace packages.

In accordance with one example embodiment, a die carrier 218 is further provided, wherein the die carrier 218 enables repeatable alignment (e.g., for 3D integration), as provided herein. The die carrier 218, for example, further provides structural support to generally prevent warpage of the thin top die(s) and further provides heat dissipation during an operation of the POP arrangement, as will be discussed further infra.

Figure 6A:
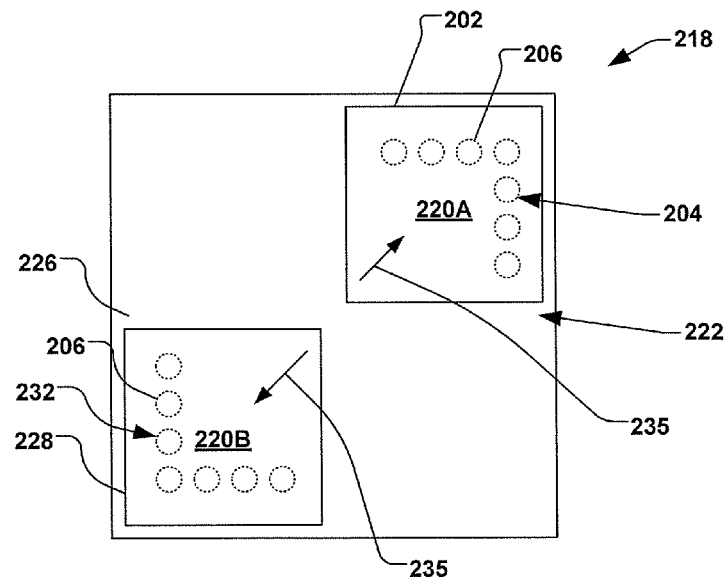
FIGS. 6A-6C illustrate examples of package-on-package arrangements having a die carrier configured to enable proper alignment in WLCSP stacking of one or more top dies on a BOT bottom die package.
Figure 6B:
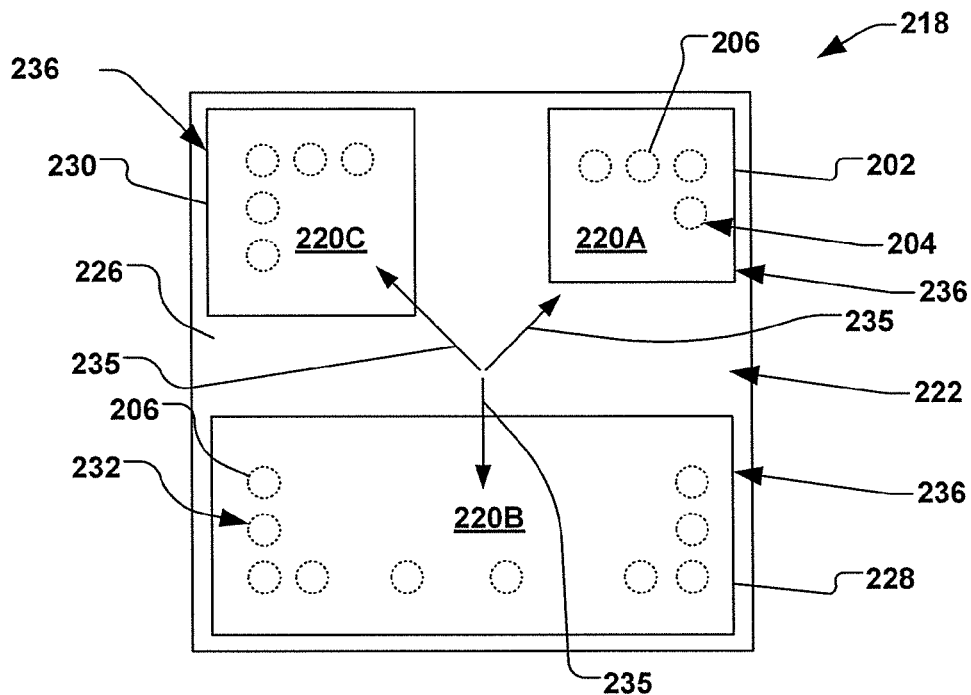
Figure 6C:
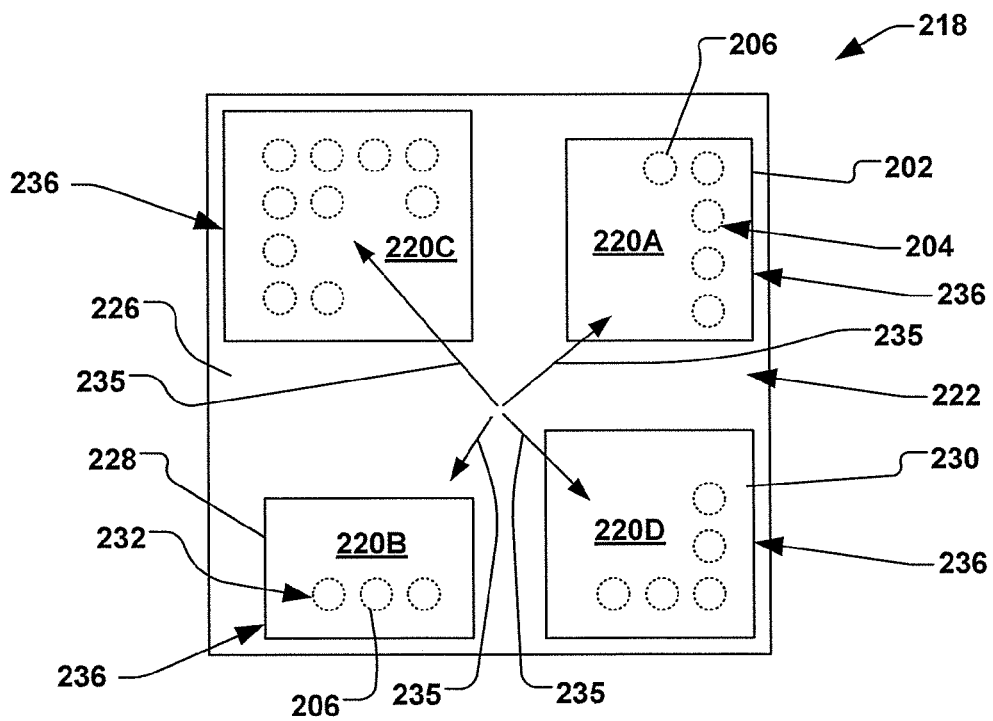
Figure 7:
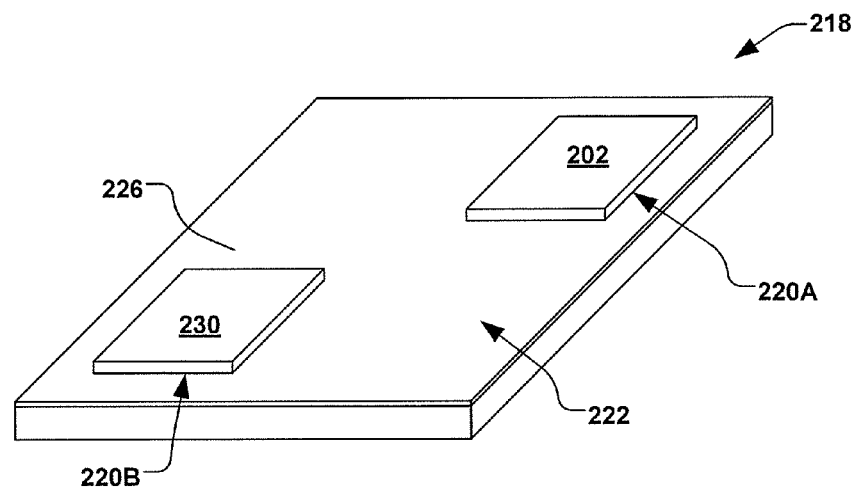
FIG. 7 illustrates another example of a package-on-package arrangement having a die carrier configured to enable proper alignment of one or more top dies on a TSV bottom die package.
Figure 8:
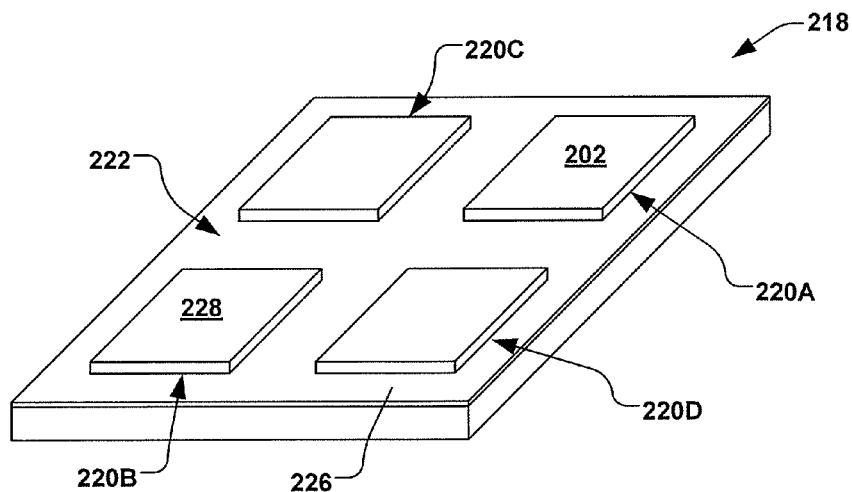
FIG. 8 illustrates still another example of a package-on-package arrangement having a die carrier configured to enable proper alignment in a fan-out WLCSP stacking of one or more top dies on a bottom die package.

According to one example, the die carrier 218 is illustrated in FIGS. 6-8 as having a plurality of mounting regions 220A-220D defined on a bottom surface 222 thereof. The plurality of mounting regions 220A-220D, for example, are generally symmetrically arranged across the bottom surface 222 of the die carrier 218. It should be again noted that the number and arrangement of the plurality of mounting regions 220 is not limited by the number and arrangement shown in the Figures, and can be any number or arrangement suitable for a particular package-on-package architecture. As illustrated in FIGS. 3-5 and 7-8, for example, a top surface 224 of the first top die 202 is generally adhered to the die carrier 218 at a first of the plurality of mounting regions (e.g., mounting region 220A). In one example, an adhesive layer 226 is disposed on the bottom surface 222 of the die carrier 218 in at least one of the plurality of mounting regions 220, wherein the first top die 202 is generally adhered to the die carrier 218 at a first of the plurality of mounting regions (e.g., mounting region 220A) via the adhesive layer 226. The adhesive layer 226, for example, comprises a thin film adhesive that is laminated to the die carrier 218, wherein the adhesive layer 226 generally adheres and maintains a position of at least the first top die 202 with respect to the die carrier 218.

Figure 3:
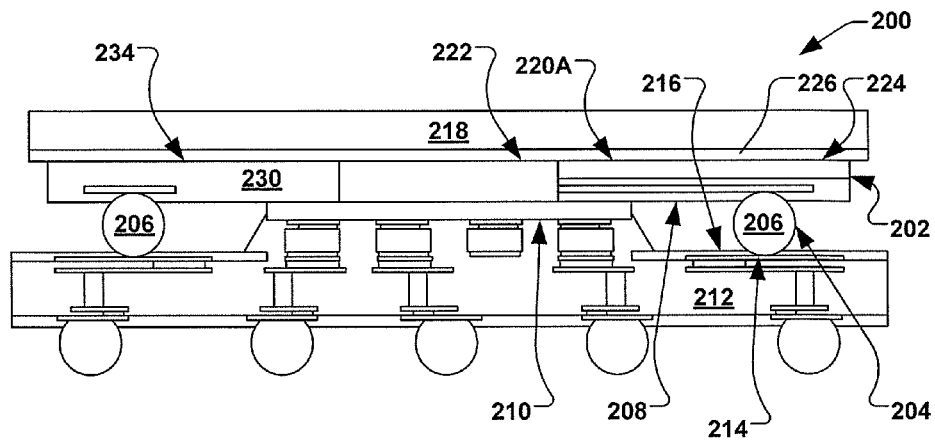
FIG. 3 illustrates a top view of a die carrier that provides top die alignment according to one example.
Figure 4:
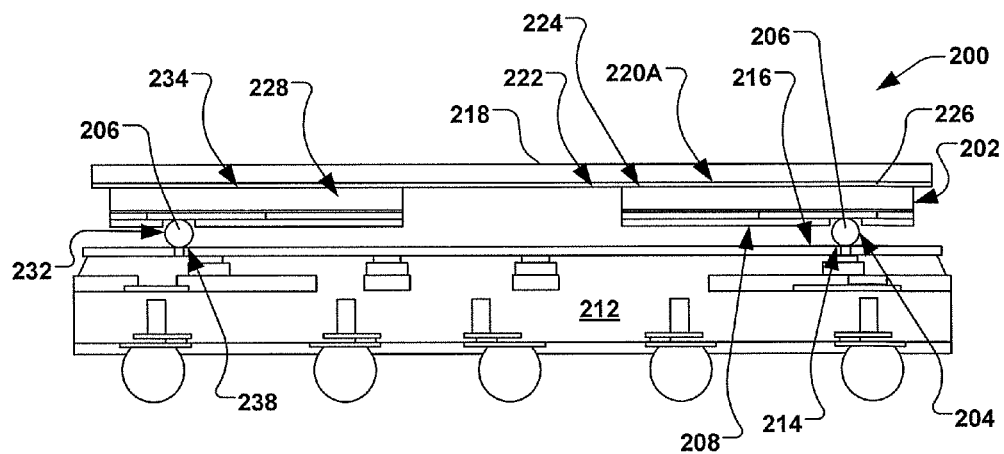
FIG. 4 illustrates a perspective view of an alternative embodiment of a die carrier that enables top die alignment.
Figure 5:
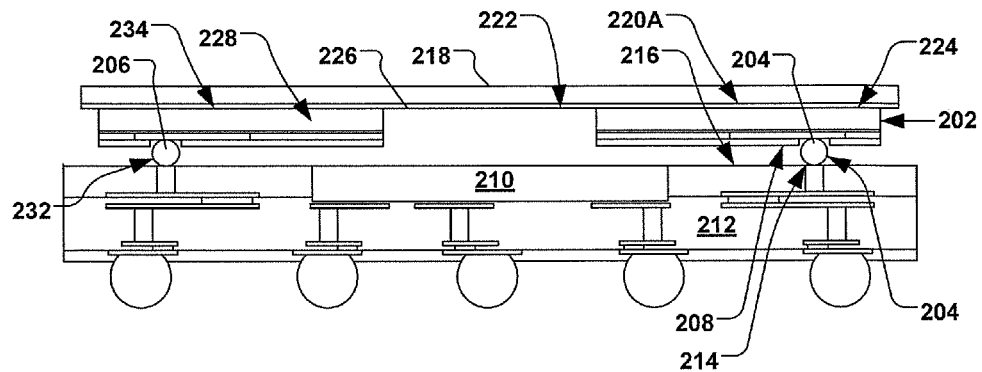
FIG. 5 illustrates a perspective view of another alternative embodiment of a die carrier that enables top die alignment.

In one embodiment of the present disclosure, a second top die 228, such as illustrated in FIGS. 3 and 5, or a dummy die 230, such as illustrated in FIG. 4, is further generally fixed to the die carrier 218 at a second of the plurality of mounting regions (e.g., mounting region 220B) of the die carrier 218 via the adhesive layer 226, wherein the second top die 228 or dummy die 230 comprises a second arrangement 232 of solder bumps 206 associated with a respective bottom surface 234 of the second top die 228 or dummy die 230. In one example, the first arrangement 204 of solder bumps 206 and second arrangement 232 of solder bumps 206 are generally symmetric to one another when viewed perpendicular to the bottom surface 222 of the die carrier 218, such as illustrated in FIG. 6A. In another example, the surface tension (e.g., described above and illustrated as arrows 235) associated with the melting of the first arrangement 204 of solder bumps 206 and second arrangement 232 of solder bumps 206 during a reflow operation is balanced, therein generally fixing an orientation of the die carrier 218, and thus, the first top die 202 and the second top die 228 (e.g., illustrated in FIG. 8) or dummy die 230 (e.g., illustrated in FIG. 7) with respect to the bottom package 210 of FIGS. 3-5.

In accordance with one example, the first mounting region 220A and the second mounting region 220B are generally symmetric to one another across the bottom surface 222 of the die carrier 218, as illustrated in FIG. 6A. Furthermore, additional mounting regions 220C and 220D, such as illustrated in one or more of FIGS. 6B, 6C, and 8, can be provided, wherein top dies 236 (e.g., one or more of the first top die 202, second top die 228, and/or dummy die 230 or other dies) balance surface tension 235 across the die carrier 218 at the additional mounting regions. The dummy die 230 of FIGS. 3, 6B and 6C, for example, comprises an electrically non-functional die having similar solder bumps 206 to that of the first and second top dies, but does not provide electrical functionality. In another example, the second arrangement 232 of solder bumps 206 of the second top die 228, such as illustrated in FIGS. 4 and 5, are configured to electrically connect the second top die 228 to a second electrical arrangement 238 on the top surface 216 of the bottom package 210.

In accordance with still another example, the die carrier 218 comprises a material, such as a metal, configured to conduct heat away from the first top die 202, and optionally, the second top die 228. The die carrier 218, for example, comprises a material having an elastic modulus of greater than approximately 20 GPa, and can comprise one or more of nickel and copper. The die carrier 218, for example, can be a solid metal plate comprised of nickel and/or copper, and/or finished or plated with one or more metals. Other metals or materials utilized in the die carrier 218 are also contemplated, such as any other thermally conductive material or non-thermally conductive material having a significant stiffness to maintain the positions of at least the first top die 202, and optionally, the second top die 228 with respect to the bottom package 210 during a reflow process.

Figure 9:
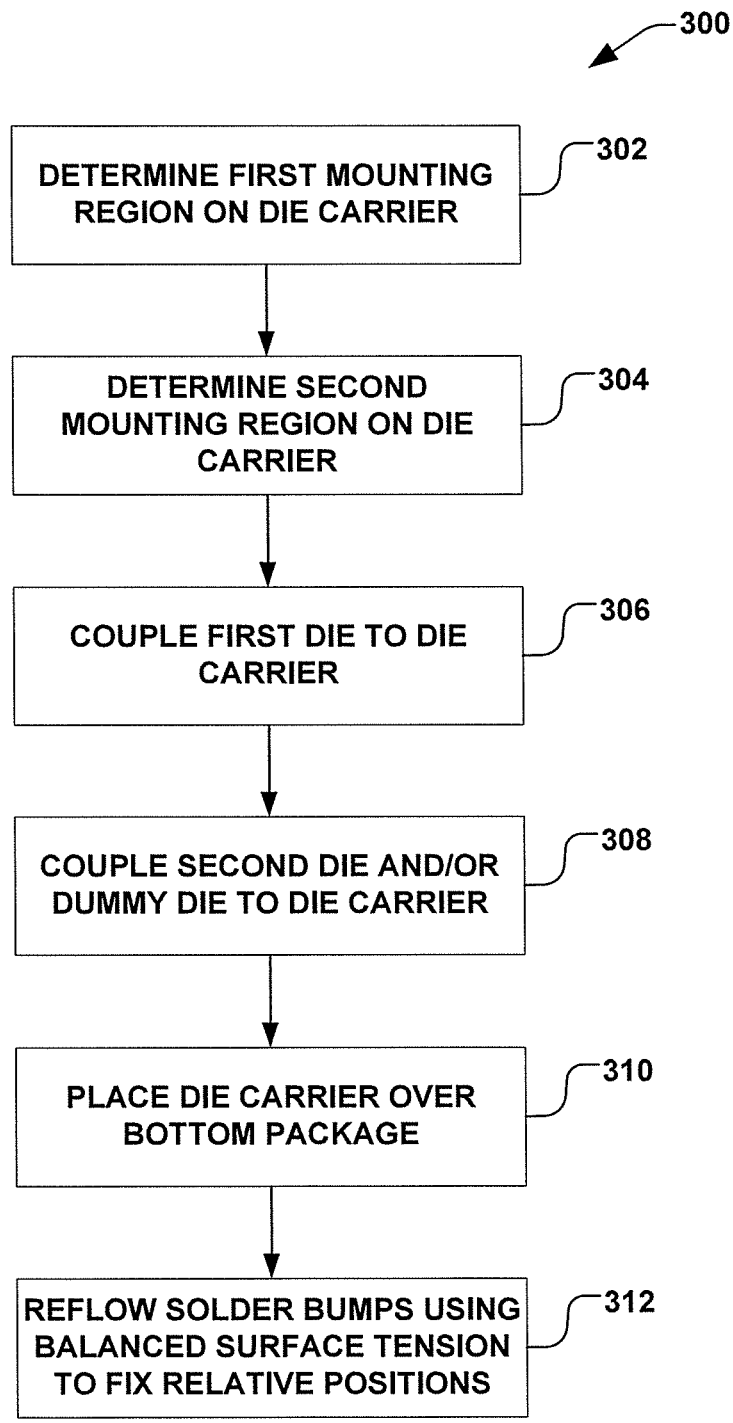
FIG. 9 illustrates a flow diagram of a method for maintaining alignment of a top die in a package-on-package arrangement.

FIG. 9 illustrates another example embodiment of a method 300 for aligning a top die onto a bottom die or intermediate substrate. It will be appreciated that although method 300 has been illustrated with respect to two top dies or a single top die and a dummy die, the method 300 can be similarly applied to any number of top dies, thereby allowing consistent alignment of multiple top dies in an efficient manner.

Further, while the method 300 provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

As illustrated at act 302 of FIG. 9, a first mounting region on a die carrier is determined. The determination of the first mounting region, for example, is based on a mating of a first arrangement of solder bumps associated with a first top die and a first electrical arrangement on a bottom package. In act 304, one or more of a second mounting region on the die carrier and a second arrangement of solder bumps on one or more of a second top die and a dummy die is determined. The determination in act 304, for example, is based, at least in part, on a balancing and/or symmetry of the first and second arrangements of solder bumps with respect to one another when viewed perpendicular to a bottom surface of the die carrier. The determination of the second mounting region, for example, can be further based on a mating of the second arrangement of solder bumps to a second electrical arrangement on the bottom package.

In act 306, the first top die is generally coupled to the first mounting region of the die carrier, and in act 308, the one of the second die and dummy die is coupled to the second mounting region of the die carrier. Coupling one or more of the first top die, second top die, and dummy die to the die carrier in acts 306 and 308, for example, comprises adhering a respective top surface of the one or more of the first top die, second top die, and dummy die to a bottom surface of the die carrier via an adhesive.

Act 310 illustrates placing the die carrier over the bottom package, therein matingly contacting at least the first arrangement of solder bumps with the first electrical arrangement. Likewise, act 310 may further comprise matingly contacting the second arrangement of solder bumps with the second electrical arrangement. Alternatively, the dummy die can comprise an electrically non-functional die, wherein when the dummy die is coupled to the second mounting region of the die carrier and the die carrier is placed over the bottom package, the second arrangement of solder bumps matingly contacts an electrically non-functional arrangement on the bottom package.

In act 312, the first and second arrangements of solder bumps are melted and/or reflowed, such by providing heat to the plurality of solder bumps, wherein the determination in act 304 generally balances a surface tension associated with the melting of the first and second arrangements of solder bumps. Accordingly, the die carrier generally fixes an orientation of at least the first top die with respect to the bottom package.

It will be appreciated that while reference is made throughout this document to exemplary structures in discussing aspects of methodologies described herein, those methodologies are not to be limited by the corresponding structures presented. Rather, the methodologies (and structures) are to be considered independent of one another and able to stand alone and be practiced without regard to any of the particular aspects depicted in the Figures. Additionally, layers described herein can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for maintaining die alignment during a reflow operation, the method comprising:
    determining a first mounting region on a die carrier based on a mating of a first arrangement of solder bumps associated with a first top die and a first electrical arrangement on a bottom package;
    determining a second mounting region on the die carrier and a second arrangement of solder bumps on an electrically non-functional die based on a symmetry of the first and second arrangements of solder bumps to one another when viewed perpendicular to a bottom surface of the die carrier;
    coupling the first top die to the first mounting region of the die carrier;
    coupling the electrically non-functional die to the second mounting region of the die carrier;
    placing the die carrier over the bottom package, therein matingly contacting at least the first arrangement of solder bumps with the first electrical arrangement; and
    reflowing the first and second arrangements of solder bumps, wherein the determination of the first mounting region the second mounting region and second arrangement of solder bumps balances a surface tension associated with a melting of the first and second arrangements of solder bumps, wherein the die carrier generally fixes an orientation of at least the first top die with respect to the bottom package concurrent with reflowing the first and second arrangements of solder bumps.

2. The method of claim 1, wherein the determination of the second mounting region is further based on a mating of the second arrangement of solder bumps to a second electrical arrangement on the bottom package.

3. The method of claim 1, wherein coupling one or more of the first top die, second top die, and electrically non-functional die to the die carrier comprises adhering a respective top surface of the one or more of the first top die, second top die, and electrically non-functional die to a bottom surface of the die carrier via an adhesive.

4. The method of claim 1, wherein when the electrically non-functional die is coupled to the second mounting region of the die carrier and the die carrier is placed over the bottom package, the second arrangement of solder bumps matingly contacts an electrically non-functional arrangement on the bottom package.

5. A method for maintaining die alignment during a reflow operation, the method comprising:
    determining a first mounting region on a bottom surface of a die carrier, wherein the first mounting region is based on a mating of a first arrangement of solder bumps associated with a bottom surface of a first top die with a first electrical arrangement on a top surface of a bottom package;
    determining a second mounting region on the bottom surface of the die carrier, wherein the determination of the second mounting region is based on a mating of a second arrangement of solder bumps associated with a respective bottom surface of a second top die and an electrically non-functional die with the top surface of a bottom package;
    coupling a top surface of the first top die to the first mounting region of the die carrier;
    coupling a top surface of the second top die and electrically non-functional die to the second mounting region of the die carrier;
    placing the first arrangement of solder bumps and the second arrangement of solder bumps on the top surface of the bottom package, therein at least mating the first arrangement of solder bumps with the first electrical arrangement; and
    reflowing the first arrangement of solder bumps and second arrangement of solder bumps, wherein the determination of the first and second mounting regions balances a surface tension associated with a melting of the first arrangement of solder bumps and second arrangement of solder bumps, and wherein an orientation of at least the first top die is generally fixed with respect to the bottom package by the die carrier concurrent with reflowing the first and second arrangements of solder bumps.

6. The method of claim 5, wherein the determination of the second mounting region is further based on a mating of the second arrangement of solder bumps to a second electrical arrangement on the top surface of the bottom package.

7. The method of claim 5, wherein coupling the respective top surface of the first top die, second top die, and electrically non-functional die to the die carrier comprises adhering the first top die, second top die, and dummy die to the bottom surface of the die carrier via an adhesive.

8. The method of claim 5, wherein when the top surface of the electrically non-functional die is coupled to the second mounting region of the die carrier, and wherein when the die carrier is placed over the bottom package, the second arrangement of solder bumps matingly contacts an electrically non-functional arrangement on the top surface of the bottom package.

* * * * *